(12) United States Patent
Kawahara

(10) Patent No.: US 8,610,337 B2
(45) Date of Patent: Dec. 17, 2013

(54) PIEZOELECTRIC DEVICE AND METHOD FOR MANUFACTURING SAME

(75) Inventor: Hiroshi Kawahara, Tokyo (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 291 days.

(21) Appl. No.: 13/120,256

(22) PCT Filed: Sep. 24, 2009

(86) PCT No.: PCT/JP2009/004789
§ 371 (c)(1),
(2), (4) Date: Mar. 22, 2011

(87) PCT Pub. No.: WO2010/035457
PCT Pub. Date: Apr. 1, 2010

(65) Prior Publication Data
US 2011/0309720 A1    Dec. 22, 2011

(30) Foreign Application Priority Data
Sep. 29, 2008   (JP) .................................. 2008-251180

(51) Int. Cl.
*H01L 41/00*    (2013.01)
(52) U.S. Cl.
USPC ........... 310/344; 310/348; 310/365; 310/366; 310/370
(58) Field of Classification Search
USPC .......................... 310/344, 348, 365, 366, 370
See application file for complete search history.

(56) References Cited

U.S. PATENT DOCUMENTS

| 5,430,345 | A  | * | 7/1995 | Takahashi | 310/348 |
| 7,134,198 | B2 | * | 11/2006 | Nakatani et al. | 29/841 |
| 2002/0113523 | A1 | * | 8/2002 | Endoh | 310/344 |
| 2010/0033061 | A1 | * | 2/2010 | Ichikawa et al. | 310/344 |
| 2010/0123248 | A1 | * | 5/2010 | Yajima | 257/741 |
| 2010/0133958 | A1 | * | 6/2010 | Umeki et al. | 310/364 |
| 2011/0062825 | A1 | * | 3/2011 | Kawahara | 310/344 |

FOREIGN PATENT DOCUMENTS

| JP | 10-022773 | A | 1/1998 |
| JP | 10-126205 | A | 5/1998 |
| JP | 2006-180169 | A | 7/2006 |
| JP | 2006-197278 | A | 7/2006 |
| JP | 2007-129327 | A | 5/2007 |

(Continued)

OTHER PUBLICATIONS

International Search Report, PCT/JP2009/004789, mailed Nov. 24, 2009.

*Primary Examiner* — Derek Rosenau
*Assistant Examiner* — Bryan Gordon
(74) *Attorney, Agent, or Firm* — Alix, Yale & Ristas, LLP

(57) ABSTRACT

A piezoelectric device employs solder on a roughened surface to improve bonding of electrical contacts with the device package. The device package includes a base, a crystal frame and a lid. The base includes connecting electrodes on a side of the base adjacent the crystal frame. The base has a through hole and a through hole electrode formed in the through hole in electrical contact with the connecting electrodes. The through hole is sealed with a sealing material and a first external electrode layer, which is electrically connected to the through hole electrode, is formed on an outside surface of the base opposite the piezoelectric plate. A second external electrode layer is formed to cover the first external electrode layer and the sealing material.

18 Claims, 6 Drawing Sheets

(56) References Cited

FOREIGN PATENT DOCUMENTS

| JP | 2007-300460 A | 11/2007 |
| JP | 2008-147895 A | 6/2008 |
| JP | 2008-211543 A | 9/2008 |

\* cited by examiner

FIG. 3

| average roughness Ra($\mu$m) | foot pattern scratch test |
|---|---|
| 2.10 | not delaminated |
| 2.03 | not delaminated |
| 1.83 | not delaminated |
| 0.48 | not delaminated |
| 0.40 | not delaminated |
| 0.10 | not delaminated |
| 0.05 | delaminated |
| 0.01 | delaminated |
| 0.00 | delaminated |

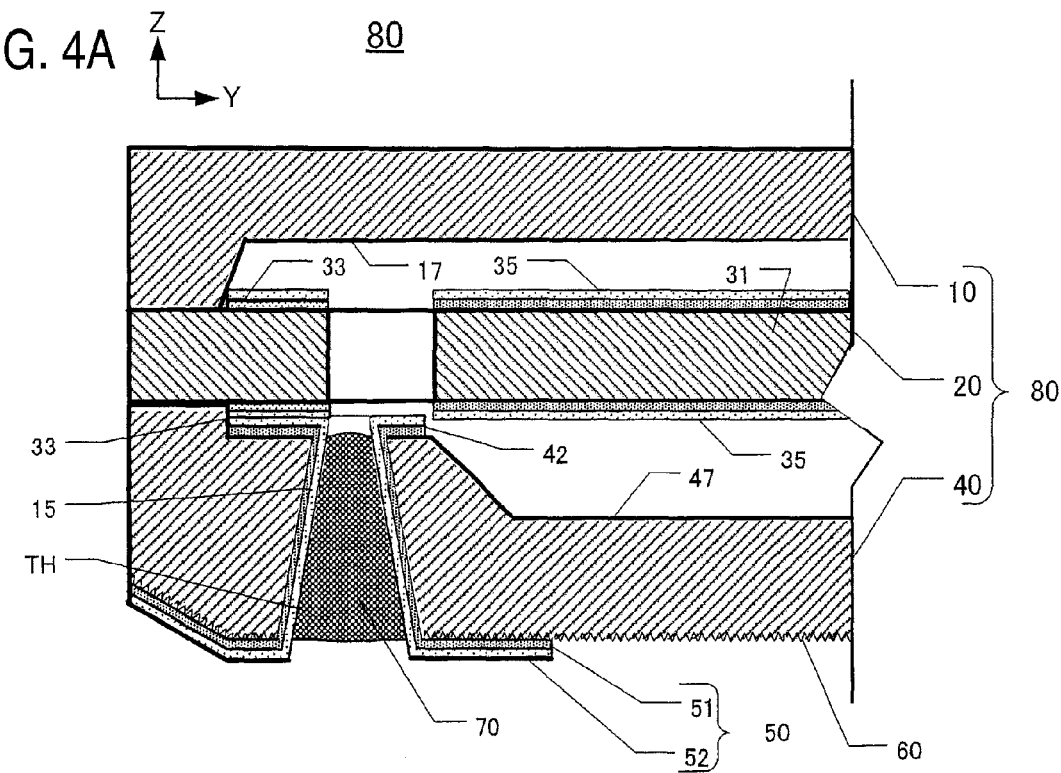
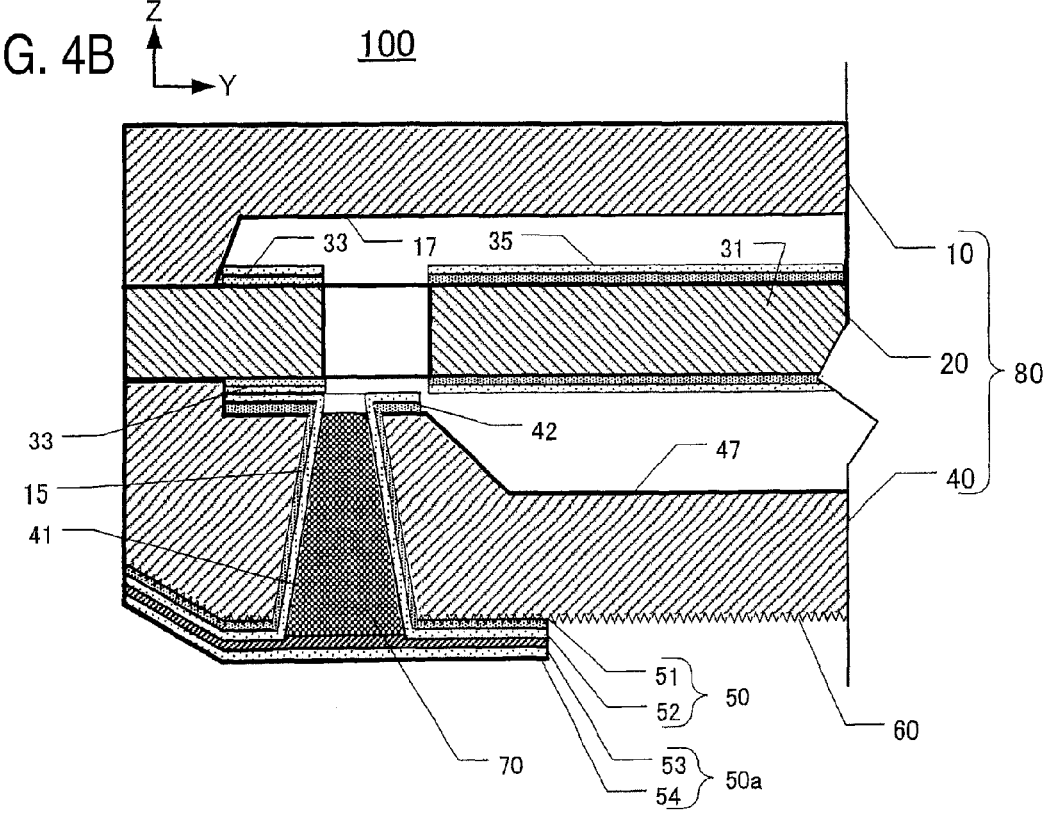

PIEZOELECTRIC DEVICE AND METHOD FOR MANUFACTURING SAME

FIELD

The present invention relates to a manufacturing method for a piezoelectric device containing a piezoelectric vibrating piece within the package thereof.

DESCRIPTION OF THE RELATED ART

Piezoelectric devices such as piezoelectric vibrators or oscillators are widely used in small information devices, mobile phones, or mobile communication apparatus or piezoelectric gyro-sensors. With the progress of miniaturization and/or increases in the operating frequency of mobile communication apparatus, piezoelectric oscillators used in this equipment must be progressively smaller and/or operate at higher frequency.

Conventionally, a piezoelectric device comprises a package formed by layering and bonding a lid made of glass or ceramic material and a package member made of glass or ceramic material. A piezoelectric vibrating piece is mounted within the package and an external electrode is formed at the bottom of the package for surface mounting. The external electrode is a Au layer or Ag layer formed on a Cr, Ni, or Ti layer. The material of Cr adheres to glass, but it is not suitable for soldering at surface mounting so that the material of Au which adheres to Cr and is suitable for soldering is formed on the Cr. As the double layer, Cr/Au, Cr/Ni, Ni/Au, Ti/Au and W/Au are used, and as a laminated film, Cr/N/Pd and Cr/Ni/Au are used. Such piezoelectric device disclosed in Japan Unexamined Patent Application No. 2006-197278 is known.

The piezoelectric device manufactured by using such glass or ceramic package is manufactured by the wafer. Then, the stress generated at cutting of individual piezoelectric device from the piezoelectric wafer causes delamination between the external electrode and the bottom of the package; therefore, the strength at mounting of the piezoelectric device on a board can be lower, for example. Further, partial correction after mounting by solder or insufficient adhesiveness at re-mounting may have possibility to cause delamination of electrodes.

Therefore, Japan Unexamined Patent Application No. 2007-197278 discloses a technique that the external electrode and the bottom of the package are not easily delaminated by roughening the bottom surface of the package called the anchor effect.

However, neither one of them is a piezoelectric device that a through hole is formed on the base of the package. In order to enhance mass production of the piezoelectric device, a piezoelectric device that a piezoelectric frame wafer having a piezoelectric vibrating piece is sandwiched and bonded between a lid wafer and a base wafer in the air and then a through hole is sealed by a sealing material in a vacuum state or inert gas has been appeared. A part of the external electrode of such piezoelectric device provided with the through hole is occupied with a sealing material called "foot pattern". For the sealing material, an alloy including gold (Au) is used, but this alloy has lower conductivity than gold (Au) and it is also difficult to be bonded on a mounting board by solder.

SUMMARY

Thus, the purpose of the present invention is to form a package formed by siloxane bonding of a lid wafer, a piezoelectric frame wafer provided with a piezoelectric vibrating piece, and a base wafer provided with through holes. Then, the through holes are sealed by a sealing material in a vacuum state or inert gas. After the sealing, by forming the external electrode layer so as to cover the sealing material, the piezoelectric device with good soldering and is good conductivity is provided.

A piezoelectric device of a first aspect is a device formed by bonding a lid, a piezoelectric plate including a piezoelectric vibrating piece on which an excitation electrode is formed and an extraction electrode extracted from the excitation electrode, and a base having a through-hole. The base comprises a connecting electrode connected to the extraction electrode at a surface that faces the piezoelectric plate, a through hole electrode formed on the through hole and electrically connected to the connecting electrode, a first external electrode layer electrically connected to the through hole electrode and formed on the opposite surface of the piezoelectric plate, a sealing material for sealing the through hole electrode, and a second external electrode layer formed so as to cover the first external electrode layer and the sealing material.

Because the sealing material on the external electrode layers is covered, the second external electrode layer can be fixed firmly and conductivity can be secured when the piezoelectric device is soldered on a mounting board.

The piezoelectric device of a second aspect is that the connecting electrode, the through hole electrode, and the first external electrode layer comprises a first base layer and a first top layer, and the first base layers of the connecting electrode, the through hole electrode, and the first external electrode are formed at once and the first top layers of the connecting electrode, the through hole electrode, and the first external electrode are formed at once.

The first bottom layer or the first top layer is formed at once so that manufacturing of the piezoelectric device can be easier.

The piezoelectric device of a third aspect, wherein an arithmetic average roughness Ra of a surface which is an opposite surface of the piezoelectric plate of the base is more than or equal to 0.1 µm and the first external electrode layer is formed on the surface.

When the arithmetic average roughness R is more than or equal to 0.1 µm, delamination of the first external electrode layer does not occur. Thus, even when the piezoelectric device is in need of removal from the mounting board after mounting, the piezoelectric device can be mounted again.

The piezoelectric device of a fourth aspect is that a taper surface is formed toward the periphery of the base on an area where the first external electrode layer is formed.

If the taper surface is formed, bonding strength of soldering of the piezoelectric device can be obtained sufficiently when it is soldered on the mounting board. Further, when the piezoelectric device is mounted on the mounting board, checking of soldering can be done easily.

A method for manufacturing a piezoelectric device of a fifth aspect is to form a piezoelectric device by bonding a lid, a piezoelectric plate including a piezoelectric vibrating piece on which an excitation electrode is formed and an extraction electrode extracted from the excitation electrode, and a base having a through-hole. The method comprises steps of a first electrode layer forming for forming a connecting electrode formed on the piezoelectric plate of the base, a through hole electrode formed on the through hole and electrically connected to the connecting electrode, a first external electrode layer formed on a opposite surface of the piezoelectric plate and electrically connected to the through hole electrode, sealing the through hole electrode by a sealing material; and a second electrode layer forming for forming a second external electrode layer so as to cover the first external electrode layer and the sealing material.

After the through holes formed in the first electrode forming step is sealed by a sealing material, forming of the second electrode to cover the sealing material in the second electrode forming step is performed. Thus, the second external electrode layer can secure firm fixation and conductivity.

In the fifth aspect, the first electrode forming step of a sixth aspect forms a first base layer and forms a first top layer thereon, and the second electrode forming step forms a second base layer and forms a second top layer thereon.

The method for forming a piezoelectric device of a seventh aspect comprises, in the fifth aspect, a step of roughening for forming an opposite surface of the piezoelectric plate of the base with more than or equal to 0.1 μm of an arithmetic average roughness Ra before the first electrode forming step.

When the opposite surface of the piezoelectric plate of the base is roughened, delamination of the first external electrode layer does not occur.

The method for forming a piezoelectric device of a eighth aspect comprises, in the fifth aspect, that a taper surface is formed on an area where the first external electrode is formed toward the periphery of the base before the roughening step.

By forming the taper surface, bonding strength can be obtained when the piezoelectric device is mounted on the mounting board by soldering.

The piezoelectric device of the present invention is a surface-mount type piezoelectric device which can be re-soldered, and the piezoelectric device can be removed from the mounting board more than once. Thus, using of the piezoelectric device in a development state of electric equipments such as mobile information apparatus can be easier. Multiple-layer configuration of the external electrode can make the thickness of one layer thinner, and shortened times for the layer forming can suppress increasing of temperature at forming of layer and also generation of abnormal projection called hillock generated at layer forming at high temperature can be suppressed. Moreover, it can provide a piezoelectric device that delamination between the external electrode and the package bottom 60 does not occur easily because soldering adhesion at partial correction or re-mounting after mounting by solder is obtained.

BRIEF DESCRIPTION OF THE DRAWINGS

FIG. 3 shows delamination status resulted from a scratch test of the electrode film of arithmetic mean roughness Ra at the bottom where the surface is roughened.

FIG. 4A is an enlarged cross-sectional view of the package 80.

FIG. 4B is an enlarged cross-sectional view of the first piezoelectric device 100.

DETAILED DESCRIPTION

First Embodiment

Configuration of the First Piezoelectric Device 100

Figure 1A:
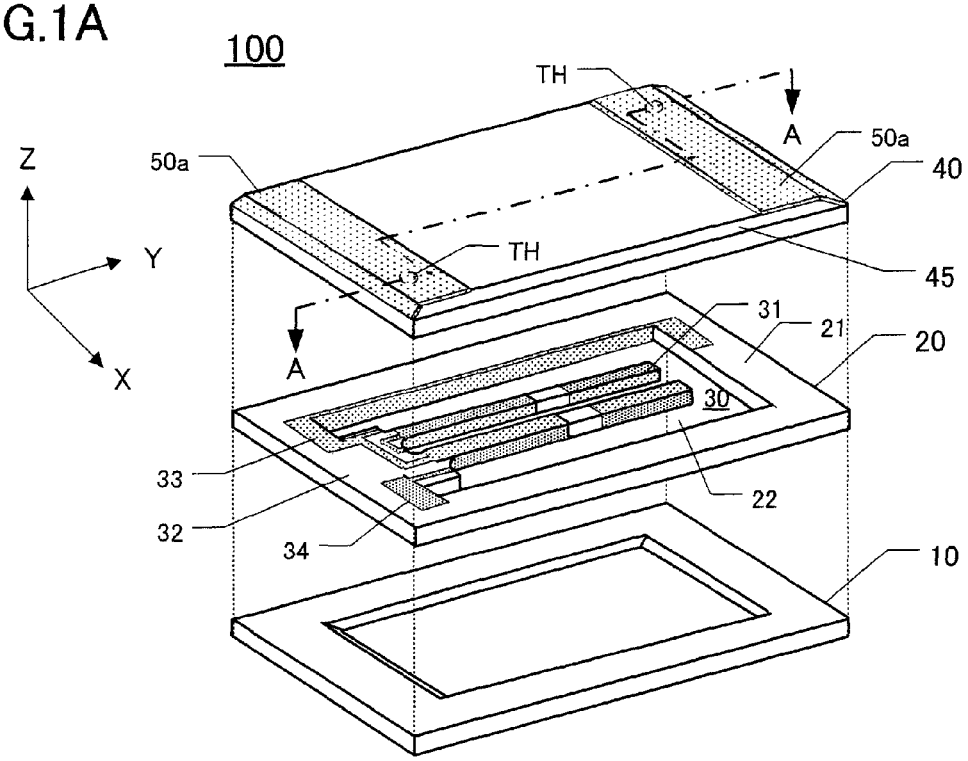
FIG. 1A is a perspective view of the first piezoelectric device 100 which is separated as each wafer seen from the base 40 side.
Figure 1B:
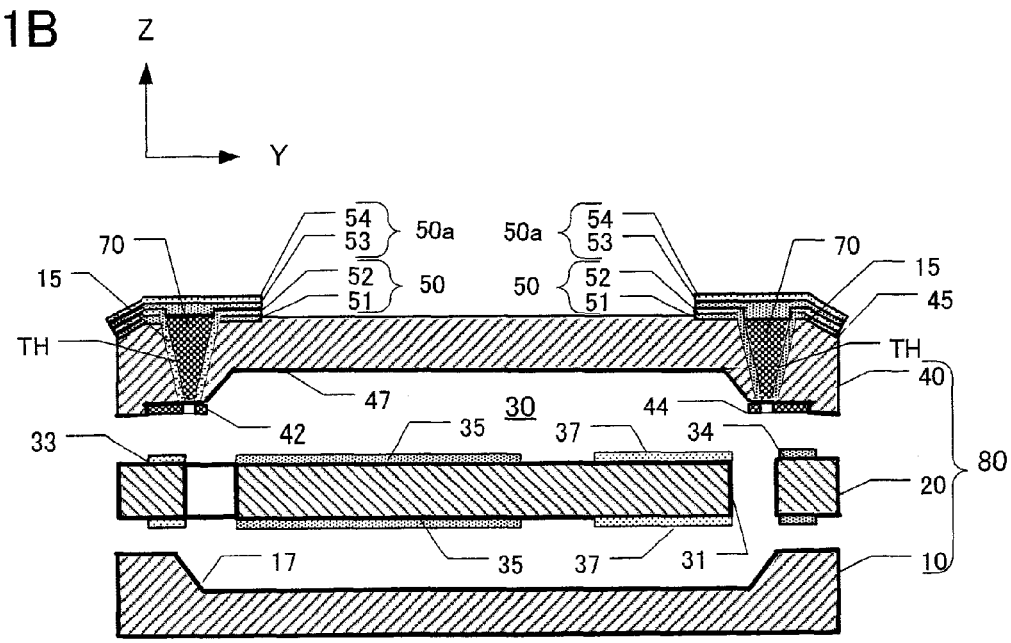
FIG. 1B is a cross-sectional view along the A-A line of FIG. 1A.

FIGS. 1A and 1B are schematic views of the first piezoelectric device 100 provided with the tuning-fork type crystal vibrating piece 30 of this embodiment. FIG. 1A is a perspective view of the first piezoelectric device 100 which is separated as wafer seen from the base 40 side, and FIG. 1B is a cross-sectional view along the A-A line of FIG. 1A.

As shown in FIG. 1A, the first piezoelectric device 100 comprises a base 40, a crystal frame 20, and a lid 10. The lid 10 and the base 40 are made of a crystal material. The crystal frame 20 has a tuning-fork type crystal vibrating piece 30 formed by etching.

The lid 10 is bonded to the bottom of the crystal frame 20 having the tuning-fork type crystal vibrating piece 30 and the base 40 is bonded on the top of the crystal frame to form the package 80 of the first piezoelectric device 100. That is, the lid 10 and the base 40 are bonded to the crystal frame 20 by siloxane bonding (Si—O—Si). The lid 10 has a lid concavity 17 that faces the crystal frame 20.

The crystal frame 20 has the tuning-fork type crystal vibrating piece 30 at its center and an outer frame 21 at outer side, and at between the tuning-fork type crystal vibrating piece 30 and the outer frame 21, a space 22 is formed. The tuning-fork type crystal vibrating piece 30 has a base portion 32 and a pair of vibrating arms 31 extending from the base portion 32. The base portion 32 and the vibrating arms 31 are surrounded by the outer frame 21. The space 22 defining the profile of the tuning-fork type crystal vibrating piece 30 is formed by wet etching. The tuning-fork type crystal vibrating piece 30 has the same thickness of the outer frame 21.

As shown in FIGS. 1A and 1B, a first excitation electrode 35 and a second excitation electrode 36 are formed on a first main surface and a second main surface respectively of the tuning-fork type crystal vibrating piece 30. The first excitation electrode 35 is connected to a first extraction electrode 33 formed on the base portion 32 and the outer frame 21, and the second excitation electrode 36 is connected to the second extraction electrode 34 formed on the base portion 32 and the outer frame 21. At the distal ends of the vibrating arms 31 of the tuning-fork type crystal vibrating piece 30, a weight portion 37 is formed respectively. The first and second extraction electrode 33, 34, the first and second excitation electrodes 35, 36, and the weight portion 37 are formed concurrently by photolithography. The crystal vibrating piece 30 oscillates with a predetermined frequency when a voltage is applied. The weight portions 37 are formed such that the vibrating arms 31 of the tuning-fork type crystal vibrating piece 30 oscillates easily and also for frequency adjustment.

The base 40 has a base concavity 47 that faces the crystal frame 20. The base 40 has a taper surface 45 on a surface opposite surface that faces the crystal frame 20, which slopes toward periphery. On the base 40 through-holes TH, a first connecting electrode 42, a second connecting electrode 44, and a first external electrode layer 50 comprising two layers are formed, and a through hole wiring 15 is formed on the through hole TH. The base 40 will be explained later with FIG. 2A.

First, the first piezoelectric device 100 forms the package 80 by siloxane bonding and then a sealing material 70 is placed on respective through holes TH which is upward. The sealing material 70 is then melted by heating in a vacuum reflow furnace with a predetermined temperature for a certain amount of time to seal the through holes TH. The sealing material 70 is made of one kind from a eutectic metal of gold-germanium (Au12Ge) alloy, of gold-silicon (Au3.15Si) alloy, and of gold-tin (Au20Sn) alloy.

As shown in FIGS. 1A and 1B, after the through holes TH of the package 80 are sealed, a second external electrode layer 50a comprising two layers is formed so as to cover the first external electrode layer 50 and the sealing material 70. Then, the first piezoelectric device 100 provided with an external electrode comprising four layers is formed.

In FIGS. 1A and 1B, only one first piezoelectric device 100 is illustrated, but hundreds of them are formed on one wafer for mass production in an actual manufacturing and devices are cut into individual first piezoelectric device 100 in a dicing step. The fist external electrode layer 50 and the second external electrode layer 50a of the first piezoelectric device 100 are not delaminated by the stress occurred at cutting of the piezoelectric wafer into individual device 100. That is, electrically high-reliable first piezoelectric device is formed.

Figure 2A:
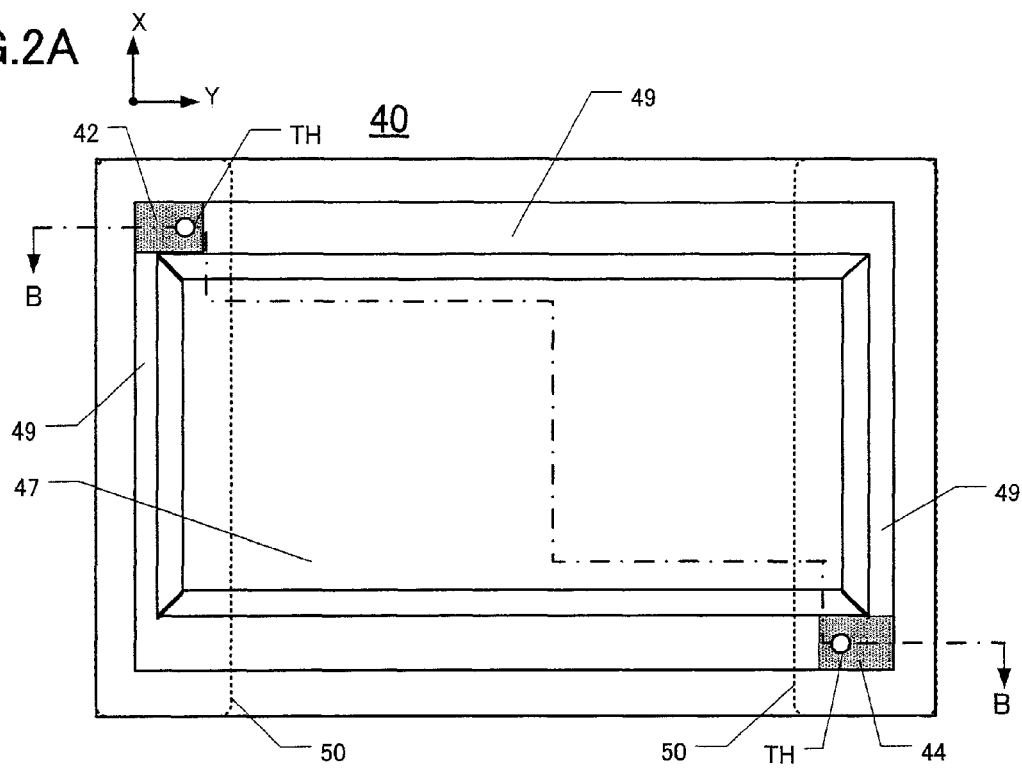
FIG. 2A is a top view of the base 40.
Figure 2B:
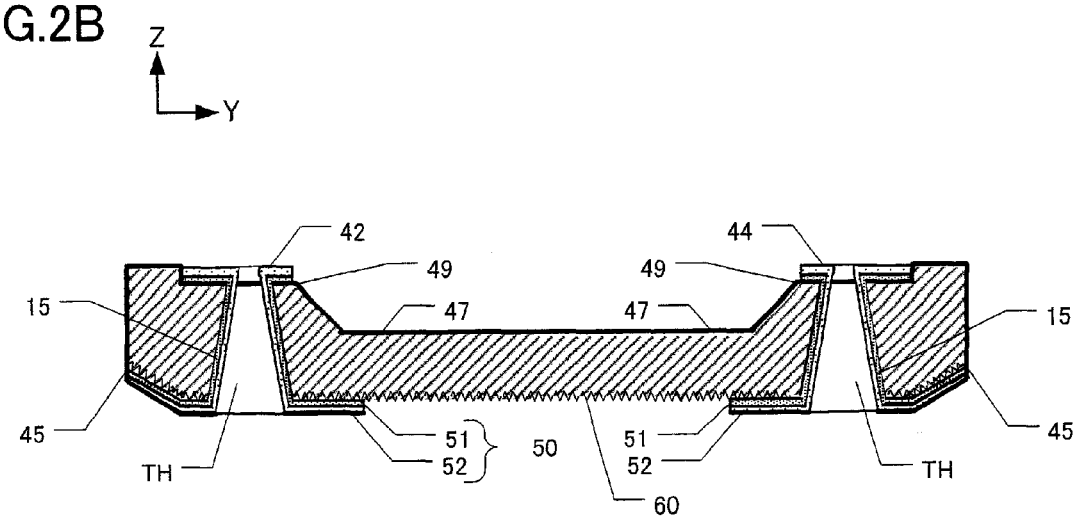
FIG. 2B is a cross-sectional view along the B-B line.

(Configuration of base 40) FIG. 2A is a top view of the base 40 and FIG. 2B is a cross-sectional view along the B-B line. The first base 40 is formed from a Z-cut crystal and, as shown in FIGS. 2A and 2B, has a base concavity 47 that faces the crystal frame 20 so as not to touch the tuning-fork type crystal vibrating piece 30. A step 49 is formed around the base concavity 47 of the base 40. A first connecting electrode 42 and the second connecting electrode 44 are formed at portions of the step 49. The height of the first connecting electrode 42 and the second connecting electrode 44 is 200 angstroms to 3000 angstroms and if the step 49 is not formed, the periphery of the base 40 and the outer frame portion 21 of the crystal frame 20 may be a failure of the siloxane bonding (Si—O—Si). The step 49 is formed with the depth between 150 angstroms to 2000 angstroms.

The through holes TH are formed on the step 49 by wet etching so as to fully penetrate the base 40. The through hole wiring 15 is formed on respective through holes TH. At portions of the step 49, the first connecting electrode 42 and the second connecting electrode 44 which connect the through holes TH are formed. The first connecting electrode 42 and the second connecting electrode 44 are electrically connected to the first external electrode layer 50 formed on the base 40 through the through hole wiring 15 of the through hole TH.

The taper surface 45 is formed toward the periphery of the bottom surface 60 of the base 40. Surface roughening is given to the bottom surface 60 of the base 40 and an arithmetic average roughness Ra is equal to or more than 0.1 μm. The first external electrode layer 50 is also formed on the bottom surface 60 of the base 40. The first connecting electrode 42, the second connecting electrode 44, the through hole wiring 15, and the first external electrode layer 50 comprises two layers, which a first metal layer 51 of nickel or chrome and a second metal layer 52 of gold are formed by sputtering or vacuum deposition. The surface roughening of the bottom surface 60 of the base 40 makes the first external electrode layer 50 hard to delaminate. By providing the taper surface 45 on the periphery of the base 40, soldering for surface mounting can be easier and also it will be resistible for impact from outside due to sufficient bonding by the soldering.

As the method of the surface roughening, wet etching using hydrofluoric acid, sand blasting using alumina abrasive, plasma etching using carbon tetrafluoride, and ion milling using ionized argon are listed. In this embodiment, the sand blasting method using alumina abrasive is used. By providing the surface roughening on the bottom surface 60 of the base 40, film adhesion is increased and delamination-free package can be formed.

FIG. 3 is a table for determining the delamination status resulted from a scratch test performed on the electrode film of the arithmetic average roughness Ra of the surface roughening.

The scratch test is executed by scratching with a diamond indenter having a certain curvature radius on the first external electrode layer 50 pressing with increasing load to calculate the adhesion strength from the load value generated from breaking of the first external electrode layer 50. At the test, possibility of delamination of the first external electrode layer 50 is verified by applying the fact that interface delamination occurs when sheering stress acting on the interface excesses the adhesion strength at the scratch of the first external electrode layer 50 with the diamond indenter with a certain amount of load. As a result, when the arithmetic average roughness Ra is more than or equal to 0.1 μm, the delamination of the first external electrode layer 50 does not occur, but when the arithmetic average roughness Ra is less than or equal to 0.05 μm, the delamination of the first external electrode layer 50 occurs. The arithmetic average roughness Ra is determined based on JIS1994.

(Forming of the first piezoelectric device 100) FIG. 4A is a preparation step for manufacturing the first piezoelectric device 100, which explains the package 80 where the through holes TH are sealed by the sealing material 70 and the first external electrode layer 50. FIG. 4A shows the condition that the lid 10, the crystal frame 20, and the base 40 are bonded and the through holes TH are sealed by the sealing material. Explanation overlapping the explanation for the base 40 done in FIG. 2A is omitted. The configuration around the second connecting electrode 44 which is not illustrated is the same configuration as of the first connecting electrode 42 so that the explanation is omitted.

First, in the air, the lid 10, the crystal frame 20, and the base 40 are bonded by siloxane bonding to form the package 80. The package 80 is placed upside down such that the base 40 is the top, and a ball-like sealing material 70 made of gold-germanium (Au12Ge) is placed on the through holes TH of the base 40. The package on which the ball-like sealing material 70 is placed is moved to a vacuum reflow furnace having a temperature about 350 C. The air inside of the package 80 is exhausted from a space between the ball-like sealing material 70 and the through hole TH and the inside of the package 80 becomes a vacuum state.

After that, the sealing material 70 starts to melt. When the sealing material 70 melts, a gas is generated from the sealing material 70, but the gas is also absorbed by the vacuum reflow furnace so that the gas is not remained in the package 80. The ball-like sealing material 70 often keeps its ball-like shape due to the surface tension, so the sealing material 70 is flattened by a non-illustrated tool. So, the sealing material 70 gets into the through hole TH as shown in FIG. 4A. Because the through hole wiring 15 is formed at the through hole TH, molten sealing material 70 flows out along the through hole wiring 15. That is, the through hole wiring 15 enhances wettability and the sealing material 70 seals the through hole TH. With the above-mentioned steps, the package 80 is sealed with a predetermined vacuum degree.

It is explained that the package 80 on which the sealing material is placed is delivered to the vacuum reflow furnace to make the inside a vacuum state, but the inside of the package 80 can be filled with an inert gas by injecting an inert gas after the vacuum reflow furnace is vacuumed.

FIG. 4B is a figure to explain the second external electrode layer 50A of the first piezoelectric device 100 where the through holes TH are sealed by the sealing material 70. The first piezoelectric device 100 shown in FIG. 4B is where the second external electrode layer 50a is formed on the package 80 shown in FIG. 4A.

As shown in FIG. 4B, the second external electrode layer 50a comprising a third metal layer 53 and a fourth metal layer 54 is formed by deposition or sputtering so as to cover the first external electrode layer 50 and the sealing material 70. The third metal layer 53 is nickel or a nickel-chrome (Ni, Cr) alloy, and the fourth metal layer 54 is a gold layer. The external electrode of the first piezoelectric device 100 is a four-layer comprising the first external electrode layer 50 and the second external electrode 50a. The second external electrode layer 50a covers the sealing material 70 so that the sealing material 70 is not appeared on the surface as an external electrode. Because the gold layer of the fourth metal layer 54 appears on the surface, when the first piezoelectric device 100 is soldered to the surface mounting board 85, the gold layer of the fourth metal layer 54 spreads to the solder 75 (FIG. 6) and the first piezoelectric device 100 is fixed firmly.

The nickel or nickel-chrome alloy of the third metal layer 53 is a metal that easily form an oxidized film, but it is blocked the oxidation process by the gold layer of the fourth metal layer 54. The gold layer of the fourth metal layer 54 of the second external electrode 50a spreads into the solder at the initial soldering, but the nickel or nickel-chrome alloy of the third metal layer 53 remains within the second external electrode so that repeating soldering can be performed. When the soldering is performed repeatedly on the first piezoelectric device 100, the third metal layer 53 already lost the gold layer of the fourth metal layer 54, but it is blocked the oxidation because it is covered with a soldering film.

When the first piezoelectric device 100 is separated individually from the piezoelectric wafer, delamination does not occur between the first and second external electrode layers 50, 50a and the package bottom 60. That is, because the surface of the package bottom 60 is roughened, delamination is suppressed due to the anchor effect. Thus, even when the soldering is performed on the first piezoelectric device 100 repeatedly, the first external electrode layer 50 and the second external electrode layer 50a are sustained.

Second Embodiment

Configuration of the Second Piezoelectric Device 110

Figure 5:
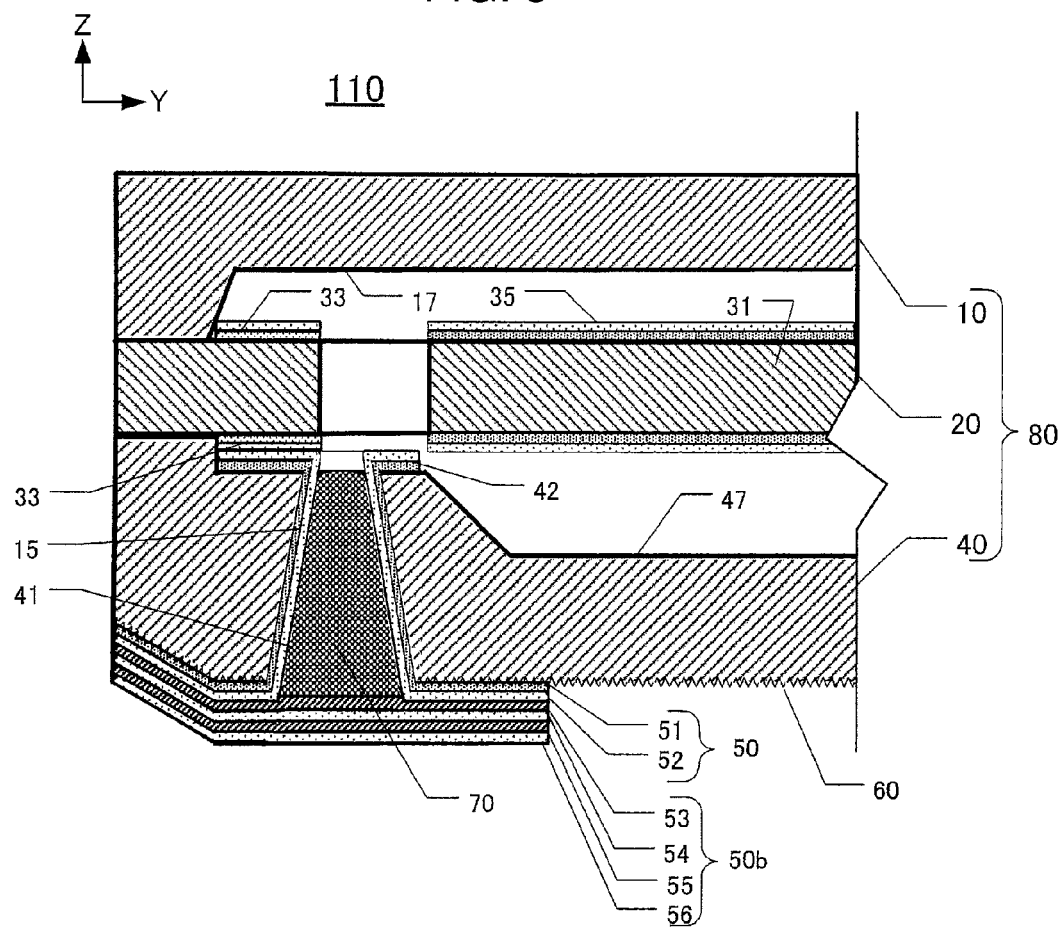
FIG. 5 is an enlarged cross-sectional view of the second device 110 provided with the tuning-fork type crystal vibrating piece 30.

FIG. 5 is an enlarged cross-sectional view of the second device 110 provided with the tuning-fork type crystal vibrating piece 30. The difference between the first piezoelectric device 100 and the second piezoelectric device 110 is that a four-layer second external electrode layer 50b is formed so as to cover the first external electrode layer 50 and the sealing material 70. The same members as the first embodiment have the same numberings and only differences will be explained below.

FIG. 5 shows a condition that the through hole TH is sealed by the sealing material 70 and then the second external electrode layer 50b is formed.

As show in FIG. 5, the second external electrode layer 50b comprising the third metal layer 53, the fourth metal layer 54, a fifth metal layer 55, and the sixth metal layer 56 is formed by deposition or sputtering so as to cover the first external electrode layer 50 and the sealing material 70. The third metal layer 53 is nickel or a nickel-chrome alloy, the fourth metal layer 54 is a gold layer, the fifth metal layer 55 is nickel or a nickel-chrome alloy, and the sixth metal layer 56 is a gold layer. That is, the external electrode of the second piezoelectric device 110 comprises the first external electrode layer 50 and the second external electrode layer 50b so that it has a six-layer.

In FIG. 5, the first metal layer 51 and the second metal layer 52, and the third metal layer 53 through the sixth metal layer 56 are illustrated as the same thickness, but the thickness of the third metal layer 53 through the sixth metal layer 56 can be formed thinner. That is, the time for deposition or sputtering for each layer can be shortened. Moreover, small projections formed on the metal layer at formation of the layer of the third metal layer 53 through the sixth metal layer 56 called hillock formation also can be prevented.

The nickel or nickel-chrome alloy of the fifth metal layer 55 is a metal that easily form an oxidized film, but it is blocked the oxidation process by the gold layer of the sixth metal layer 56 which is soldered. The gold layer of the sixth metal layer 56 of the second external electrode 50b spreads into the solder at the initial soldering, but the nickel or nickel-chrome alloy of the fifth metal layer 55 remains within the second external electrode so that repeating soldering can be performed. The thickness of the sixth metal layer 56 can be thinner so that the amount of gold spreading into the solder can be lowered. When the soldering is performed on the second piezoelectric device 110 repeatedly, even the sixth metal layer 56 already lost the gold layer 54, the nickel or nickel-chrome alloy of the fifth metal layer 55 is blocked the oxidation process because it is covered by a solder film.

If the second piezoelectric device 110 is soldered repeatedly and the nickel or nickel-chrome alloy of the fifth metal layer 55 and the gold layer of the sixth metal layer 56 are lost, the nickel or nickel-chrome alloy of the third metal layer 53 and the gold layer of the fourth metal layer 54 are still present so that further soldering can be performed.

When the second piezoelectric device 110 is separated from the piezoelectric wafer on which a plurality of the second piezoelectric devices 110 are formed, the stress of delamination is applied between the first and second external electrode layers 50, 50b and the package bottom 60, but the delamination caused by the stress can be suppressed due to the anchor effect by roughening of the surface.

Figure 6:
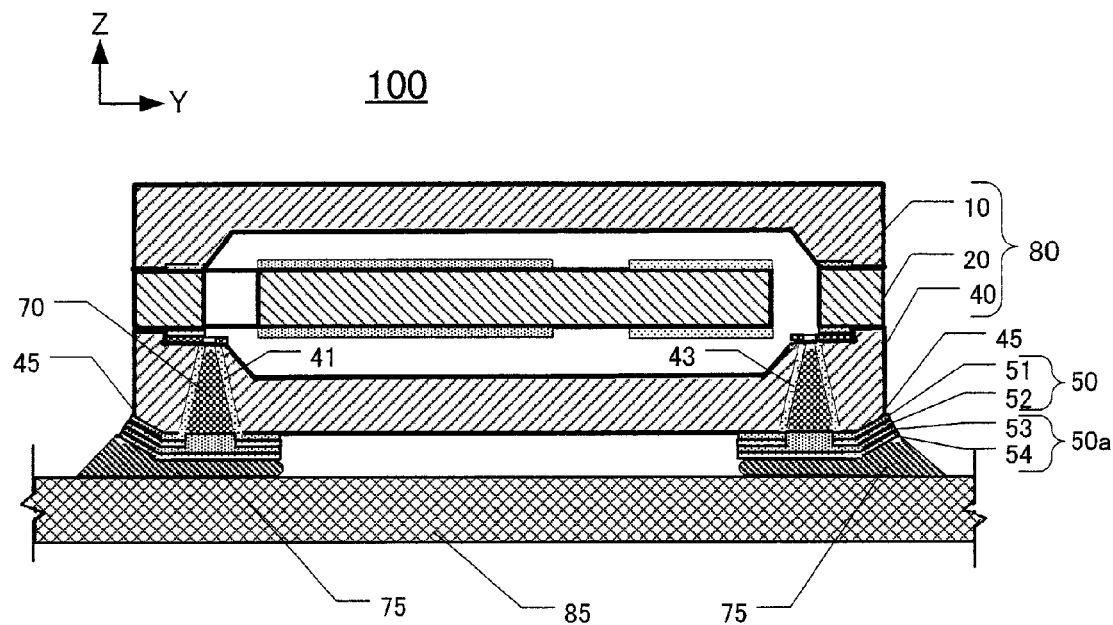
FIG. 6 is a cross-sectional view where the first piezoelectric device 100 is mounted and soldered on the mounting board 85.

FIG. 6 is a cross-sectional view where the first piezoelectric device 100 is mounted and soldered on the mounting board 85. The base 40 of the first piezoelectric device 100 has a taper surface 45 toward the periphery. Thus, bonding area of the solder 75 and the mounting board 85 is wider and the adhesion strength of solder can be obtained sufficiently so that effect of impact from outside of the package can be reduced. Further, because of the presence of the taper surface, checking of soldering at surface mounting of the first piezoelectric device 100 to the mounting board 85 can be easier and inspection steps at manufacturing can be reduced as well.

While example embodiments have been described of the present invention, it will be understood by those of skill in the art that various changes in form and details may be made therein without departing from the spirit and scope of the following claims. For example, by making the thickness of the outer frame thinner than of the tuning-fork type crystal vibrating piece 30, a board-shape base and lid can be used without forming concavities on the base and lid. Further, instead of the tuning-fork type crystal vibrating piece 30, an AT-cut vibrating piece and a surface acoustic wave (SAW) piece can be used.

Further, in the foregoing embodiment nickel or chrome material is used for the first metal layer 51, but nickel-chrome alloy, titanium, or tantalum can be used. For the third metal layer 53 and the fifth metal layer 55, nickel or nickel-chrome alloy material is used, but also chrome, titanium, or tantalum can be used.

What is claimed is:

1. In a piezoelectric device formed by bonding a lid, a piezoelectric plate including a piezoelectric vibrating piece on which an excitation electrode is formed and an extraction electrode extracted from the excitation electrode, and a base having a through-hole extending from an outside surface to an inside surface of the base, the base comprising:
   a connecting electrode connected to the extraction electrode at the inside surface facing the piezoelectric plate;
   a through hole electrode formed on the through hole and electrically connected to the connecting electrode;
   a first external electrode layer electrically connected to the through hole electrode and formed on the outside surface of the base;
   a sealing material for sealing the through hole electrode; and
   a second external electrode layer formed so as to cover the first external electrode layer and the sealing material, wherein the connecting electrode, the through hole electrode, and the first external electrode layer comprises a first base layer and a first top layer, and the first base layers of the connecting electrode, the through hole electrode, and the first external electrode are formed at once and the first top layers of the connecting electrode, the through hole electrode, and the first external electrode are formed at once.

2. The piezoelectric device of claim 1, wherein an arithmetic average roughness Ra of a surface which is an opposite surface of the piezoelectric plate of the base is more than or equal to 0.1 μm and the first external electrode layer is formed on the surface.

3. The piezoelectric device of claim 1, wherein a taper surface is formed toward the periphery of the base on an area where the first external electrode layer is formed.

4. The piezoelectric device of claim 1, wherein the piezoelectric vibrating piece is an AT-cut vibrating piece, a surface acoustic wave piece, or a tuning-fork type crystal vibrating piece.

5. A method for manufacturing a piezoelectric device formed by bonding a lid, a piezoelectric plate including a piezoelectric vibrating piece on which an excitation electrode is formed and an extraction electrode extracted from the excitation electrode, and a base having a through-hole extending from an outside surface to an inside surface of the base, the method comprising steps of:
   forming a first electrode layer of a connecting electrode on the inside surface of the base facing the piezoelectric plate, a through hole electrode formed on the through hole and electrically connected to the connecting electrode;
   forming a first external electrode layer on the outside surface of the base and electrically connected to the through hole electrode;
   sealing the through hole electrode with a sealing material; and
   forming a second external electrode layer so as to cover the first external electrode layer and the sealing material, wherein the first electrode forming step forms a first base layer and forms a first top layer thereon, and the second electrode forming step forms a second base layer and forms a second top layer thereon.

6. The method of claim 5 further comprising a step of roughening for forming an opposite surface of the piezoelectric plate of the base with more than or equal to 0.1 μm of an arithmetic average roughness Ra before the first electrode forming step.

7. The method of claim 5, wherein a taper surface is formed on an area where the first external electrode is formed toward the periphery of the base before the roughening step.

8. The method of claim 5 further comprising a step of roughening for forming an opposite surface of the piezoelectric plate of the base with more than or equal to 0.1 μm of an arithmetic average roughness Ra before the first electrode forming step.

9. The method of claim 5, wherein a taper surface is formed on an area where the first external electrode is formed adjacent a periphery of the base before the roughening step.

10. The method of claim 6, wherein a taper surface is formed on an area where the first external electrode is formed adjacent a periphery of the base before the roughening step.

11. The piezoelectric device of claim 1, wherein a taper surface is formed adjacent a periphery of the base on an area where the first external electrode layer is formed.

12. The piezoelectric device of claim 2, wherein a taper surface is formed adjacent a periphery of the base on an area where the first external electrode layer is formed.

13. The piezoelectric device of claim 1, wherein the piezoelectric vibrating piece is an AT-cut vibrating piece, a surface acoustic wave piece, or a tuning-fork type crystal vibrating piece.

14. The piezoelectric device of claim 2, wherein the piezoelectric vibrating piece is an AT-cut vibrating piece, a surface acoustic wave piece, or a tuning-fork type crystal vibrating piece.

15. The piezoelectric device of claim 1, wherein the second external electrode layer comprises a second base layer and a second top layer.

16. The piezoelectric device of claim 15, wherein the first base layer and the second base layer are formed by Ni or Cr, the first top layer and the second top layer are formed by Au or Ag.

17. The piezoelectric device of claim 15, wherein a third base layer is formed so as to cover the second top layer and a third top layer is formed so as to cover the third base layer.

18. The piezoelectric device of claim 17, wherein the third base layer formed by Ni or Cr and the third top layer is formed by Au or Ag.

* * * * *